April 16, 1963 C. J. ANDERSON 3,086,127

PULSE RESPONSIVE REGISTER INSENSITIVE TO PULSE WIDTH VARIATIONS EMPLOYING LOGIC CIRCUIT MEANS

Filed Oct. 18, 1960 2 Sheets-Sheet 1

INVENTOR.
CHARLES J. ANDERSON

INVENTOR.
CHARLES J. ANDERSON

United States Patent Office 3,086,127

Patented Apr. 16, 1963

3,086,127

PULSE RESPONSIVE REGISTER INSENSITIVE TO PULSE WIDTH VARIATIONS EMPLOYING LOGIC CIRCUIT MEANS

Charles J. Anderson, St. Paul, Minn., assignor to Sperry Rand Corporation, New York, N.Y., a corporation of Delaware Filed Oct. 18, 1960, Ser. No. 63,302
15 Claims. (Cl. 307—88.5)

This invention relates to registers of a nature used in digital computing apparatus.

Most present day digital computing devices utilize registers having a multiplicity of bistable stages to perform a variety of functions. For example, a counting register wherein the contents are changed each time a pulse is applied may be utilized for addressing memory locations and the like. Another example is that of a shifting register wherein the contents are shifted left or right from one stage to another each time a pulse is applied. In many of these devices the pulse is distributed so that it is available concurrently at the input of each stage of a register. Whether or not the pulse is allowed to pass into a given stage to change the state thereof, may be dependent on the state of the other stages as well as the state of the given stage. For example, in a four stage binary pulse counter wherein the contents of the counter are to be incremented by one for each pulse applied, the fourth stage should be set to a "1" signal state upon occurrence of a pulse if it is in the "0" signal state originally and the first three stages are in "1" states or if it is in a "1" state originally and at least one of the first three stages is in a "0" state. Another type of counter is one in which the stages are of the toggle-type, i.e., the state of the stage will change upon application of a pulse thereto regardless of its previous state. In an increment-by-one counter of the latter nature, the pulse should be applied to toggle a given stage only if all the lower order stages are "1's". In a shift register, wherein the contents of a given stage are to be shifted to the next adjacent stage upon application of a pulse, the output of the given stage is gated into the next adjacent stage by the occurrence of a pulse.

The above described exemplary devices and others similar thereto are all susceptible to erroneous operation unless the shape of the applied pulses is held to a close tolerance. For example, if the pulse width is too great in the shift register described above, a "1" could be shifted more than a single stage with a single pulse applied. Or in the counter described, a pulse of excessive width could result in incrementation by more than one for a single pulse.

Another type of device which is subject to the above described erroneous operation is a bistable toggle-type flip-flop which could be utilized in the stages of a register. For example, an excessively wide pulse could cause the flip-flop to toggle twice during the application of a single pulse.

Circuits have been developed to overcome the problems occasioned by wide tolerance pulses, but these circuits have been of the type to introduce delays into the operation of the device, as for example in the use of resistor-capacitor combinations in the input of a register stage. Additionally, so that all stages have substantially the same amount of delay, it is necessary to maintain close tolerance on the component parts of these circuits.

In this invention, the susceptibility to pulse variations is overcome by a logical circuit arrangement in each stage. The state of each stage is constantly sensed and a signal indicative of the state, is developed by the sensing means. A multiplicity of interconnected logic elements responsive to applied pulses and, at least in part, to the state indicating signal prevents the state from changing state more than once for each applied pulse.

Therefore, it is an object of this invention to provide a pulse-responsive circuit that is substantially insensitive to pulse variations.

It is a further object of this invention to provide a pulse-responsive circuit that is substantially insensitive to pulse variations without introducing delay in the speed of operation of the circuit.

Still a further object of this invention is to achieve the objects above by the logical arrangement of the circuit.

Yet a further object of this invention is to provide a logic circuit to control the toggling of a pulse-responsive bistable circuit whereby the bistable circuit is insensitive to toggling pulses of excessive width.

These and other more specific objects will be disclosed in the following specification, with reference to the drawings in which.

Figure 1:
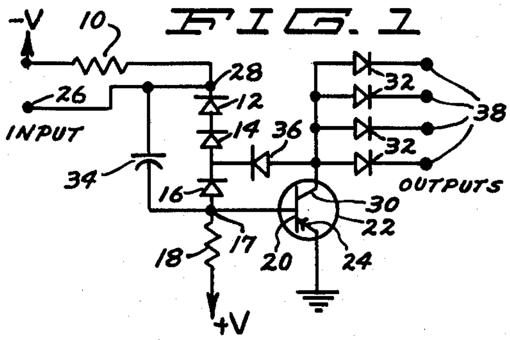
FIGURE 1 is the circuit diagram of an exemplary AND-Inverter logical element.

In FIGURE 1 there is illustrated a typical AND-Inverter circuit which can be used in the logical circuit of this invention. The series combination of resistor 10, diodes 12, 14 and 16, and resistor 18 form a voltage divider between potentials +V and —V. The base 20 of p.n.p. transistor 22 is connected to the junction of resistor 18 and diode 16 at point 17. The emitter 24 is connected to the common potential and signal return path therein shown as ground. The input to the circuit is via terminal 26 which is connected to the junction 28. The output from the circuit is taken from the collector 30 via diodes 32 and output terminals 38. Although there is shown four available outputs, no limitation thereto is intended. The maximum number of outputs is dependent on design and good engineering practice. Each of the outputs of the illustrated circuit would serve as an input to another identical circuit. For explanatory purposes, assume the input signal as applied to terminal 26 varies between zero volts and —2 volts, "0" and "1" respectively. With the input at a "0," junction 28 is zero volts therefore the base 20 is made positive by the positive potential from +V at point 17. This cuts off the conduction of the transistor. With the input a "1," —2 volts, point 17 becomes negative causing the transistor to conduct so that the collector potential approaches that of the ground potential of the emitter. With the output serving as an input to another identical circuit, it can be seen that when the input to terminal 26 is a "1," the input to the other circuit will be a "0" while a "0" input to 26 will appear as a "1" to the other circuit. The foregoing describes the inverting function of the AND-Inverter circuit. The AND function is achieved by having a single input terminal. All inputs are connected to the single common input terminal and all must be "1's" in order to place junction 28 at a negative potential to cause the transistor to conduct. If any input is a "0," junction 28 will be at zero potential and the transistor will be cutoff so that the output will be a "1." The capacitor 34, between input terminal 26 and base 20, only serves to speed up the turn-on and turn-off of the conduction of the transistor. Feedback diode 36, connected between the collector 30 and the junction of diodes 14 and 16, prevents the transistor from conducting to full saturation, thereby allowing faster turn-off of conduction.

Figure 2:
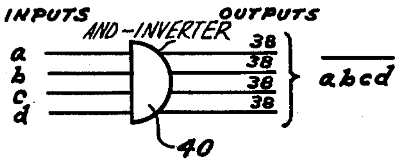
FIGURE 2 shows in block diagram form the logical function of the AND-Inverter element.

FIGURE 2 shows the logical function of the AND-Inverter element described above. The semicircle block 40 represents the circuitry of an AND-Inverter, for example the circuit shown in FIGURE 1. All of the input signals *a*, *b*, *c*, and *d*, would be connected to a common input terminal such as 26 in FIGURE 1. Each of the four outputs shown 38, represents the signal present at each of the output terminals 38 of FIGURE 1 and is therefore similarly labeled. With the four inputs, *a*, *b*, *c*, and *d*, ANDed together at the input, the output will be not *a* and *b* and *c* and *d*, as commonly shown by $\bar{a}\ \bar{b}\ \bar{c}\ \bar{d}$. All of the inputs must be "1's" to make the output a "0." If any input is a "0," the output will be "1." It should be understood that there are other circuits which will perform the logical and-inversion function as shown by FIGURE 2 and that FIGURE 1 only illustrates one exemplary circuit for descriptive purposes only, no limitation thereto being intended. Furthermore, it is well known that there are logical equivalents which can be directly substituted one for the other. For example, $\bar{a}\ \bar{b}\ \bar{c}\ \bar{d}$ is equal to $\bar{a}+\bar{b}+\bar{c}+\bar{d}$. Although the following description refers only to AND-Inverter logic elements, it is intended that logical equivalents thereto are included in the scope of this invention.

Figure 3:
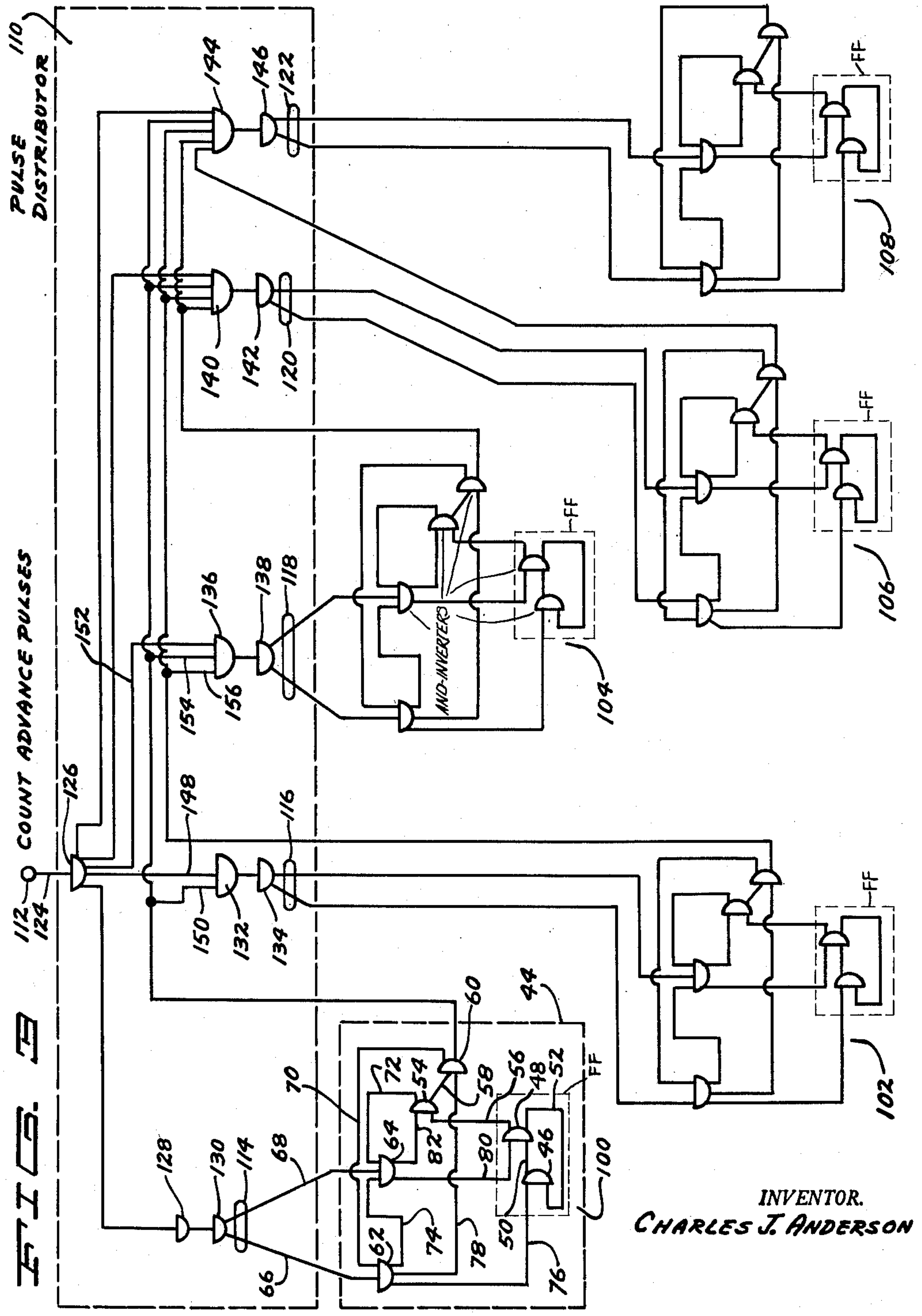
FIGURE 3 illustrates an exemplary embodiment of this invention.

Before describing the operation of the counting register shown in FIGURE 3, it is appropriate to describe the operation of a single stage thereof, for example the lowest order stage 100 as enclosed by broken line 44. Since all stages are identical, only one will be described in detail. AND-Inverter elements 46 and 48, shown in block diagram form, are conventionally interconnected to form a bistable flip-flop with the state of the flip-flop representing the state of the stage. The output of element 46 is transmitted as an input to element 48 via line 50 while one output from element 48 is fed back as an input to element 46 via line 52. The state of the flip-flop is sensed by a logical circuit comprising AND-Inverter elements 54 and 60. A second output from element 48 is conveyed to AND-Inverter element 54 via line 56 and an output from element 54 appearing on line 58 provides an input to AND-Inverter element 60. Neglecting, for the present, all other inputs to those AND-Inverters specified heretofore, it can be seen that if it is assumed that the flip-flop is in a first state such that the output of element 48 is a "0," this will be inverted by element 46 and appear as a "1" output therefrom to maintain the "0" output of element 48. Additionally, the "0" output from element 48 on line 56 will be inverted by element 54 and appear as a "1" output therefrom on line 58. Element 60, in turn, develops a "0" output, which is indicative of the previously assumed state of the flip-flop. As will be described in detail hereinbelow an additional logical circuit, comprising AND-Inverter elements 62 and 64, is cross-coupled with the above described logical circuit to control the toggling of the flip-flop and the changing of the state indicating signal.

Input pulses to the stage via lines 66 and 68 are received by elements 62 and 64, respectively. Element 62 has an additional input on line 70 which is an output from element 60. Element 64 has two additional inputs, an output from element 54 on line 72 and an output from element 62 on line 74. The other outputs from element 62 on lines 76 and 78 provide a first input to the flip-flop via an additional input to element 46, and an additional input to the element which develops the signal indicative of the state of the flip-flop, element 60, respectively. The outputs from element 64 appearing on lines 80 and 82, provide a second input to the flip-flop as an additional input to element 48, and an additional input to element 54, respectively.

Figure 4:
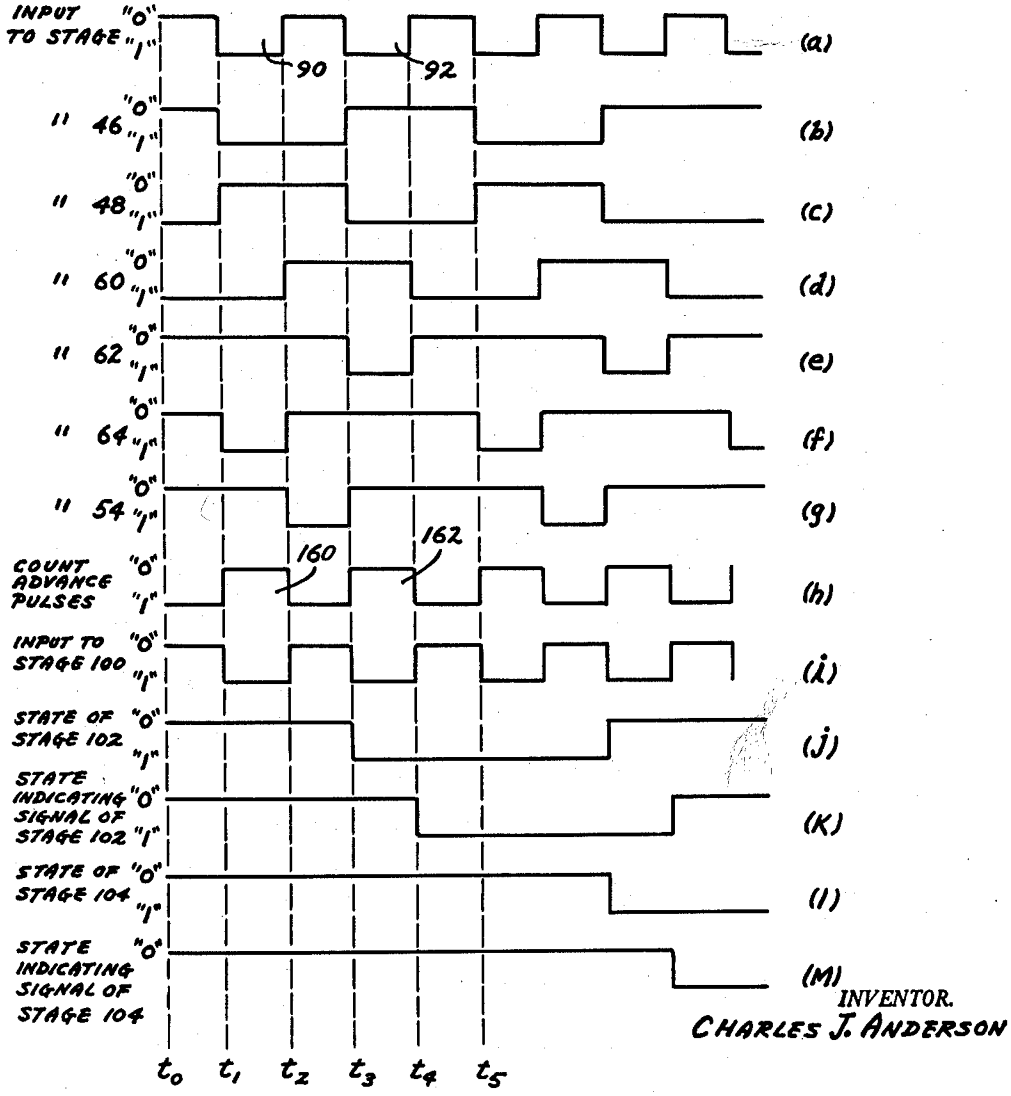
FIGURE 4 shows the signals at various points in the circuit of FIGURE 3.

The operation of the single stage can best be understood by reference to the signals shown in FIGURE 4. It should be understood that said illustrated wave forms are of the size and shape shown only for descriptive purposes, no limitation thereto intended, the only requirement being that the input signal varies between the arbitrarily chosen "0" and "1" levels to effect a change in the state of the stage. FIGURE 4(*a*) shows a train of pulses applied to the input elements of the stage, elements 62 and 64, via lines 66 and 68 respectively. Since at least one of the inputs to AND-Inverter elements 62 and 64 is a "0," from $t_0$ to $t_1$, the outputs therefrom must be a "1" during that time interval, in accordance with the logical function shown in FIGURE 2. Under the previously assumed condition that the flip-flop, comprising elements 46 and 48, is in a state such that the input to element 48 is a "1," the input to element 46 is a "0." This state will be maintained from time $t_0$ to $t_1$ since the second input to the flip-flop, the signal on line 80 ANDed at the input to element 48, is also a "1." FIGURES 4(*b*) and 4(*c*) show the inputs to elements 46 and 48 respectively. Since one of the inputs to element 54, the output from the flip-flop appearing on line 56, is a "0," the output therefrom on line 58 is a "1." The "1" on line 58 ANDed with the "1" on line 78 at the input to element 60, results in a "0" developed by element 60 appearing at the output of element 60. The input signal to element 60 is shown in FIGURE 4(*d*). The output signal from element 60 being a "0" may be referred to as a no-hold signal, more particularly in describing its function in a complete register. A "1" output from element 60 may be referred to as a hold signal.

From time $t_1$ to $t_2$, negative pulse 90 in FIGURE 4(*a*), equivalent to a "1," appears on lines 66 and 68, the leading edge of the pulse occurring at $t_1$. The no-hold or "0" signal on line 70 is ANDed with the signal on line 66 at the input to element 62 therefore the input to element 62 remains a "0," as shown in FIGURE 4(*e*), and the output remains a "1." However, the signals on lines 72 and 74 are "1's," so they AND with the input pulse on line 68 at the input to element 64, as shown in FIGURE 4(*f*), resulting in a "0" output therefrom. The "0" occurring at time $t_1$ on the second input to the flip-flop change the output from element 48 to a "1." The "1" on line 52 ANDed with the "1" on line 76, the first input to the flip-flop, at the input to element 46 changes the output therefrom to a "0." Therefore, the state of the flip-flop is changed from its original assumed state to its other stable state. Concurrently, the output from element 48 on line 56 becomes a "1," but since there is a "0" on line 82 the input to element 58 remains at a "0," as shown by FIGURE 4(*g*), and the output therefrom on line 58 remains a "1." This output being ANDed with the "1" on line 78 at the input to element 60, results in the input to element 60 remaining at a "1" and the no-hold signal still being developed therein. From the foregoing it can be seen that the initiation of toggling of the flip-flop to its opposite state occurs during the leading edge of the received pulse while the developed signal which is indicative of the state of the flip-flop is held unchanged while the toggling pulse is applied.

When the input pulse 90 is removed at time $t_2$ the input on lines 66 and 68 becomes a "0" thereby maintaining the input to element 62 a "0" while changing the input to element 64 to a "0". The first input to the flip-flop, the signal on line 76, is unchanged so does not affect the state of the flip-flop. The second input to the flip-flop, on line 80, changes to a "1", but since the other input to element 48 on line 50 is a "0", the input to element 48 remains unchanged and the output on line 56 remains a "1". So because of the logical arrangement of the AND-Inverter elements, neither input to the flip-flop results in a change of state of the flip-flop at time $t_2$. However, at time $t_2$ the input to element 54 changes to a "1" since both input lines thereto, 82 and 56, contain "1's". This results in a "0" on lines 58 and 72. The "0" on line 58 changes the input to element 60 to a "0" resulting in a "1" or hold signal output therefrom, which is indicative of the previously toggled-to state of the flip-flop.

The next input pulse, 92 in FIGURE 4(*a*), which occurs at time $t_3$, AND's with the "1" on line 70 to change the input to element 62 to a "1" resulting in a "0" output therefrom. The input to element 64 remains at "0" since the input thereto on line 72 is a "0". The "0" on the first input to the flip-flop, line 76, toggles the flip-flop back to its originally assumed state so that the input to element 48 is a "1". The "0" output from element 48 appearing on line 56 changes the input to element 54 to a "0" resulting in a "1" on line 58. However, the input to element 60 remains a "0" since line 78 is at a "0". Therefore, the logical arrangement of the AND-Inverter elements is such that a hold signal is developed by element 60 even though the flip-flop had been toggled. When pulse 92 is removed, at time $t_4$, the state of the flip-flop remains unchanged. However, the changed input to element 62 results in the input to element 60 being changed to a "1" so that a "0" or no-hold signal, indicative of the previously toggled-to-state of the flip-flop, is developed by element 60.

The foregoing describes the operation of a pulse-responsive register stage wherein each negative going input signal toggles the flip-flop while the signal which indicates the state does not change until the input signal returns toward a positive level. It is obvious that if the AND-Inverter circuit shown in FIGURE 1 were such as to comprise a positive AND function, as for example if a n.p.n. transistor with appropriate polarities of potential V and proper diode polarity were utilized, the stage would operate in a similar manner as described above with positive polarity input pulses toggling the flip-flop and the state indicating signal changing when the input returns toward the negative level.

FIGURE 3 shows a binary counting register, hereinafter referred to as a counter, incorporating five identical stages, 100–108, of the type described hereinabove. The counter shown is the type in which the count is incremented by one by each pulse applied to the counter. Counter stage 100 is the lowest order stage with each successively higher order stage numbered successively higher. Each stage reacts to a stage input pulse exactly as previously described. Therefore, the description of the counter will be limited to describing how the passing of pulses to each stage is controlled.

Pulse distributor 110 has an input terminal 112 to receive count advance pulses, of a type shown in FIGURE 4($h$), and has five pair of output lines, 114–112, one pair for each of the five stages with the lowest numbered pair providing an input to the lowest order stage 100 and each successively higher numbered pair providing an input to the successively higher order stages. The count advance pulses are conveyed via conductor 124 to the input to AND-Inverter element 126. Electrically intermediate each of the distributor output line pairs and element 126 is a pair of seriatim AND-Inverter elements, elements 128—130, for line pair 114, elements 132—134 for pair 116, elements 136—138 for pair 118, elements 140—142 for pair 120 and elements 144—146 for pair 122. It can be seen, that each of said seriatim pair of elements is associated with and provides an input pulse for, under proper conditions, a given stage of the counter. Therefore, for purposes of explanation, each of the seriatim pair of elements can be referred to as lowest order, second lowest order, etc. as their corresponding stages are so designated.

The lowest order seriatim pair of elements receives a single input to element 128 from element 126. In addition to an input from element 126, each of the remaining seriatim pair of elements receives an input from all the lower order stages. The signal on these additional inputs is a hold or no-hold signal which represents the state of the stage as developed in the stage by one of the AND-Inverter elements therein and as previously described. For example: element 132, which is in the seriatim pair of elements associated with stage 102, has an input 148 from element 126 and an input 150 from element 60 in stage 100; element 136 associated with stage 104 has, in addition to input 152 from element 126, an input 154 from stage 100 and input 156 from stage 102, both of the latter two being signals indicative of the state of the corresponding stages. In a like manner it can be seen that the inputs to the remaining seriatim pair of elements comprises a count advance pulse signal from element 126 in addition to signals indicative of the state of all lower order stages.

The count advance pulses shown in FIGURE 4($h$) applied to the pulse distributor input terminal 112 are inverted by element 126. It should be noted that the count advance pulses shown in FIGURE 4($h$) are for descriptive purposes only and need not have a fixed repetition rate as shown nor have the theoretically perfect wave shape as shown. As a matter of fact, the description herein reveals how it is possible to utilize a wide variety of pulse forms. The only criteria is that the pulses have leading and trailing edges and vary between an arbitrarily selected "0" and "1" level and are of a duration such that the speed capabilities of the AND-Inverter elements are sufficient to respond to the pulse.

Assume, for explanatory reasons, that originally all stages are in the "0" state. The element in each stage which develops the signal indicative of the state of the stage, element 60 in stage 100 and the corresponding element in each of the other identical stages, produces a "0" or no-hold signal. Positive pulse 160, FIGURE 4($h$), which is inverted by element 126, is the only input to element 128 so appears as a negative or "1" pulse at the input to element 128. The double inversion of elements 128 and 130 results in the pulse appearing on distributor output line pair 114 thereby providing a stage toggling pulse to the lowest order stage 100 to set it to the "1" state. The input to stage 100 will be the inversion of the count advance pulse signal, as shown in FIGURE 4($i$). Concurrent with the application of the inversion of pulse 160 to element 128, it is applied as an input to elements 132, 136, 140 and 144. However, ANDed at the input to each of these latter elements is the no-hold signal from each of the lower order stages, therefore no pulse will appear on their corresponding distributor output line pairs 116–122 and no stage toggling pulse will appear at the input to the corresponding stages. At time $t_2$, when the trailing edge of the count advance pulse occurs, the input to element 60 in the lowest order stage 100 goes to a "0" which results in a "1" or hold signal, indicative of the toggled-to-state of stage 1, being developed by element 60. This places a "1" on one of the inputs to each of the seriatim pair of elements in the distributor but since the output from element 126 is a "0" at that time, the input to elements 132, 136, 140 and 144 remains a "0." The next subsequent count advance pulse, 162, occurring at time $t_3$ provides a toggle pulse input to stage 100 to set it back to the "0" state. Since the inversion of pulse 162 is ANDed with the hold signal from element 60 at the input to element 132, stage 102 likewise receives a stage toggle input pulse on distributor output line pair 116. None of the remaining stages receives a toggle pulse since the seriatim pair of elements associated with each has at least one "0" signal ANDed at the input thereto. FIGURES 4($j$) and 4($l$) show the toggling pulses of stages 102 and 104 respectively while FIGURES 4($k$) and 4($m$) show the state indicating signals as developed in each of the respective stages 102 and 104. It is obvious that stage 106 would be toggled by every eighth count advance pulse and stage 108 would be toggled by every sixteenth count advance pulse.

From the foregoing description it can be seen that a pulse can be distributed concurrently to all stages and is gated to pass into those stages which meet the requirements for toggling. However, the gating means is such that the contents of the register can only be changed once during each input pulse.

It is apparent that the counter of FIGURE 3 can be modified to provide a circulating shift register as well as a variety of other register types, with the resulting advantages of this invention. This type register can be achieved by ANDing, at the input to each seriatim pair of elements, the count advance pulse signal and the signal indicative of the state of only the next lowest order stage. Additionally, the signal indicative of the state of the highest order stage, 108, would be ANDed with the count advance pulse input to the seriatim pair of the lowest order stage 100. This means there would be only two inputs to each of the elements 128, 132, 136, 140, 144. Each pulse applied would result in the state of a given stage being shifted to the next adjacent higher order stage and, as a result of this invention, only a single shift could occur for each applied pulse.

It is thus apparent that there is provided by this invention an apparatus in which the advantages and objects set forth hereinabove are achieved.

It is understood that suitable modifications may be made in the structure as disclosed provided such modifications come within the spirit and scope of the appended claims. Having now, therefore, fully illustrated and described my invention, what I claim to be new and desire to protect by Letters Patent is:

What is claimed is:

1. In a pulse-responsive multiple stage register wherein the contents are changed by an input pulse: a bistable toggle-type flip-flop in each stage, the state of said flip-flop being determinative of the state of the stage; means in each stage to sense the state of said flip-flop; first AND-Inverter means responsive to an input pulse to concurrently initiate the toggling of the flip-flop in each stage that meets the requirements for toggling by the leading edge of the input pulse; second additional AND-Inverter means in each stage responsive to said toggling initiation to prevent said flip-flop sensing means in each stage from sensing the toggled-to state of the flip-flop until the trailing edge of said input pulse.

2. A pulse-responsive register comprising: a multiplicity of stages, each stage including at least a bistable toggle-type flip-flop, the state of said flip-flop being determinative of the state of the stage, and flip-flop sensing means for developing a signal indicative of the state of said stage; a source of pulses; means intermediate said pulse source and said multiplicity of stages for distributing said pulses to all stages concurrently, said pulse distributing means including means, controlled by certain of said state indicating signals, to gate the passing of the pulses to at least some of said stages; each stage further including gated switching means adapted to receive the pulses passed to that stage controlled in part by the state indicating signal of the stage, coupled to the stage flip-flop for initiating toggling of the flip-flop in that stage during the leading edge of the pulse passed to that stage and further coupled to the flip-flop sensing means in that stage for preventing said latter means from developing a signal indicative of the toggled-to-state of the stage until the trailing edge of the pulse passed to that stage.

3. A register as in claim 2 wherein the further included gated switching means in each stage comprises at least two AND-Inverter elements.

4. A register as in claim 2 wherein the further included gated switching means in each stage comprises three AND-Inverter elements.

5. A pluse responsive register comprising: a multiplicity of stages, each stage including at least a bistable toggle-type flip-flop, the state of said flip-flop being determinative of the state of the stage, and flip-flop sensing means for developing a signal indicative of the state of said stage; a source of pulses; means intermediate said pulse source and said multiplicity of stages for distributing said pulses to all stages concurrently, said pulse distributing means including means, controlled by certain of said state indicating signals, for gating the passing of the pulses to at least some of said stages; each stage further including a pulse receiving pair of AND-Inverter elements to initiate toggling of the flip-flop during the leading edge of each received pulse and an additional AND-Inverter element responsive to the output of one of said pair electrically intermediate said flip-flop and said sensing means for preventing said sensing means from developing a signal indicative of the toggled-to-state of the stage until the trailing edge of each received pulse.

6. A pulse responsive binary register comprising: a multiplicity of bistable stages; a source of pulses, each of said pulses having a leading edge and a trailing edge; means to distribute said pulses to all stages concurrently; a bistable flip-flop in each stage comprising two cross-coupled AND-Inverter elements, the state of said flip-flop being determinative of the state of the stage; a first additional AND-Inverter element in each stage for sensing the state of said flip-flop and for developing a hold signal only when its associated stage is in a first state; means for gating the passing of the pulses from said pulse distributing means to each stage; means for transmitting the signal developed by said first additional AND-Inverter element in each stage to the gating means of certain other of said stages, each gating means thereby being enabled to pass pulses only when all said developed signals transmitted thereto are hold signals; logical circuit means in each stage, including at least a second and a third additional AND-Inverter element, electrically intermediate said gating means and said flip-flop for initiating toggling of said flip-flop only during the leading edge of a pulse received from said gating means; and further means in each stage, including a fourth additional AND-Inverter element, electrically connected to at least said third additional AND-Inverter element for preventing said first additional AND-Inverter element from developing a signal indicative of the toggle-to-state of said flip-flop until the trailing edge of the pulse received from said gating means.

7. A pulse-responsive circuit of a type to be used as a register stage comprising: a bistable flip-flop; flip-flop sensing means for developing a signal indicative of the state of said flip-flop; a pair of pulse-receiving AND-Inverter elements for initiating toggling of said flip-flop only on the leading edge of each received pulse; an additional AND-Inverter element electrically intermediate said flip-flop and said sensing means responsive at least to one of said pair of pulse-receiving elements for preventing the sensing of the toggled-to-state of the flip-flop until the trailing edge of each received pulse.

8. A pulse-responsive circuit of a type to be used as a register stage, comprising: a bistable toggle-type flip-flop including a pair of cross-coupled AND-Inverter elements, the state of said flip-flop being determinative of the state of the stage; a first additional AND-Inverter element electrically coupled to said flip-flop to develop a bi-level signal indicative of the state of the stage; input means for receiving a toggling pulse; second and third additional AND-Inverter elements responsive to said received toggling pulse to initiate a change of said flip-flop only during the leading edge of said received pulse; a fourth additional AND-Inverter element electrically intermediate said third additional AND-Inverter element and said first additional AND-Inverter element to prevent said first additional AND-Inverter element from developing a signal indicative of the toggled-to-state of said flip-flop until the trailing edge of said pulse.

9. A pulse responsive circuit of a type to be used as a register stage comprising: a bistable toggle-type flip-flop including first and second cross-coupled AND-Inverter elements, the state of said flip-flop being determinative of the state of the stage; a first additional AND-Inverter element electrically coupled to said flip-flop to develop a bi-level signal indicative of the state of the stage, said developed signal being at a first level when the stage is in a first state and at a second level when the stage is in its second state; second and third additional AND-Inverter elements to receive input pulses and to develop flip-flop toggling pulses; means for transmitting the toggling pulses from said second additional element to said first flip-flop element and for transmitting the toggling pulses from said third additional element to said second flip-flop element whereby the flip-flop is toggled alternately by the toggling pulses transmitted from said second and third additional elements; a fourth additional AND-Inverter element, electrically intermediate said state indicating signal developing element and said flip-flop, responsive to toggling pulses from said third additional element to prevent said state indicating signal from changing until the trailing edge of each flip-flop toggling pulse.

10. A pulse responsive register, comprising: a multiplicity of bistable stages; first gated switching means in each stage for developing a signal indication of the state of the stage; a source of pulses; second gated switching means, controlled at least in part by the state indicating signal of certain of said stages, electrically intermediate all stages and said pulse source for passing each pulse to at least one of said stages; third gated switching means in each stage, each respectively controlled in part by the state-indicating signal of the corresponding stage, adapted to receive the pulses passed to the stage for changing the state of the stage substantially simultaneously with the leading edge of the received pulses; said third gated switching means in each stage being coupled to the first gated switching means in the same stage to prevent the latter means from developing a signal indication of the changed state of the stage until the trailing edge of the received pulses.

11. A pulse responsive stage for a binary register, comprising: a bistable flip-flop; means coupled to said flip-flop for sensing the state of the flip-flop and for developing a signal indicative for the state; input circuit means having a pulse receiving input, a gating input and first and second outputs; means for applying said state indicating signal to said gating input; means coupled to said first output for initiating toggling of said flip-flop on the leading edge of the received pulses; and means connected between said second output and said sensing means for preventing the latter means from sensing the toggled-to-state of the flip-flop until the trailing edge of the received pulses.

12. In a pulse-responsive multiple stage register wherein the contents are changed by an input pulse: a bistable toggle-type flip-flop in each stage, the state of said flip-flop being determinative of the state of the stage; means in each stage to sense the state of said flip-flop; first gated switching means responsive to an input pulse to concurrently initiate the toggling of the flip-flop in each stage that meets the requirements for toggling by the leading edge of the input pulse; second additional gated switching means in each stage responsive to said toggling initiation to prevent said flip-flop sensing means in each stage from sensing the toggled-to-state of the flip-flop until the trailing edge of said input pulse.

13. A pulse responsive register comprising: a multiplicity of stages, each stage including at least a bistable toggle-type flip-flop, the state of said flip-flop being determinative of the state of the stage, and flip-flop sensing means for developing a signal indicative of the state of said stage; a source of pulses; means intermediate said pulse source and said multiplicity of stages for distributing said pulses to all stages concurrently, said pulse distributing means including means, controlled by certain of said state indicating signals, for gating the passing of the pulses to at least some of said stages; each stage further including a pulse receiving pair of gated switching circuit elements to initiate toggling of the flip-flop during the leading edge of each received pulse and an additional gated switching circuit element responsive to the output of one of said pair electrically intermediate said flip-flop and said sensing means for preventing said sensing means from developing a signal indicative of the toggled-to-state of the stage until the trailing edge of each received pulse.

14. A pulse-responsive circuit of a type to be used as a register stage comprising: a bistable flip-flop; flip-flop sensing means for developing a signal indicative of the state of said flip-flop; a pair of pulse-receiving gated switching circuit elements for initiating toggling of said flip-flop only on the leading edge of each received pulse; an additional gated switching circuit element electrically intermediate said flip-flop and said sensing means responsive at least to one of said pair of pulse-receiving elements for preventing the sensing of the toggled-to-state of the flip-flop until the trailing edge of each received pulse.

15. A pulse responsive register comprising: a multiplicity of bistable stages, each stage including a bistable, toggle type flip-flop with the state of the flip-flop being determinative of the state of the stage; means in each stage for sensing the state of said flip-flop and for developing a signal indication of the state of the stage; a source of pulses; first gating means electrically intermediate all stages and said pulse source; means for applying the state indicating signal of certain of said stages to said first gating means for enabling the passing of a pulse from said pulse source through said first gating means to at least one of the stages; first gated switching means in each stage adapted to receive the pulses passed to the stage and enabled by the state indicating signal of the stage for initiating toggling of the stage flip-flop during the leading edge of the received pulse; and second gated switching means in each stage responsive in part to the signal output of said first gated switching means coupled to said flip-flop sensing means for preventing said latter means from sensing the toggled-to-state of the flip-flop until the trailing edge of said input pulse.

References Cited in the file of this patent

UNITED STATES PATENTS

| | | |
|---|---|---|
| 2,551,119 | Haddad et al. | May 1, 1951 |
| 2,971,157 | Harper | Feb. 7, 1961 |
| 2,985,773 | Dobbie | May 23, 1961 |

OTHER REFERENCES

Mathias: "Static Switching Devices," from Control Engineering, May 1959, page 83.